(12) United States Patent
Saint-Marcel (10) Patent No.: US 11,373,027 B1
(45) Date of Patent: Jun. 28, 2022

(54) SYSTEM AND METHOD FOR ROUTING IN AN ELECTRONIC CIRCUIT DESIGN

(71) Applicant: Cadence Design Systems, Inc., San Jose, CA (US)

(72) Inventor: Laurent Rene Saint-Marcel, Mouans-Sartoux (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/194,589

(22) Filed: Mar. 8, 2021

(51) Int. Cl.
*G06F 30/394* (2020.01)
*G06F 30/12* (2020.01)

(52) U.S. Cl.
CPC ............ *G06F 30/394* (2020.01); *G06F 30/12* (2020.01)

(58) Field of Classification Search
CPC .................................................... G06F 30/394
USPC ........................................................ 716/139
See application file for complete search history.

(56) References Cited

U.S. PATENT DOCUMENTS

| | | | | |
|---|---|---|---|---|
| 8,839,184 B1 * | 9/2014 | Seguine | ................ | G06F 30/34 716/139 |
| 2002/0186247 A1 * | 12/2002 | Ohkubo | ............ | G06F 30/3312 715/772 |
| 2013/0298100 A1 * | 11/2013 | Hastings | ............... | G06F 30/367 716/126 |

\* cited by examiner

*Primary Examiner* — Eric D Lee
(74) *Attorney, Agent, or Firm* — Mark H. Whittenberger, Esq.; Holland & Knight LLP (57) ABSTRACT

The present disclosure relates to a method for use with an electronic design. Embodiments may include receiving, at a graphical user interface, an indication of a desired wire creation associated with an electronic design and determining a plurality of routing solutions, based upon, at least in part, the desired wire creation. Embodiments may further include simultaneously displaying the plurality of routing solutions at the graphical user interface, wherein a predicted preferred routing solution is graphically emphasized. Embodiments may also include receiving a selection from a user, at the graphical user interface, of one of the plurality of routing solutions and storing the selection for subsequent use.

18 Claims, 9 Drawing Sheets

SYSTEM AND METHOD FOR ROUTING IN AN ELECTRONIC CIRCUIT DESIGN

FIELD OF THE INVENTION

The embodiments of the present disclosure relate to a method of electronic circuit design, and more particularly, to a method for displaying potential routing solutions in an electronic circuit design.

BACKGROUND

Packaging and analog integrated circuit ("IC") layout designers are often concerned with the routing style of their electronic design and this style depends on each designer. Usually, existing tools either fail to provide any routing assistance and let the user create their wires segment by segment, or they propose the routing solution corresponding to the current user settings. In the first case, the user must exercise many mouse clicks to obtain the expected routing result and he/she loses time. In the second case, if the assistance and the routing is performed automatically by the tool and it does not match the user expectation then they must change the tool options and move their mouse back on the layout to check the new result. It takes time to change the settings to locate the best option and generate the new routing.

SUMMARY

Accordingly, an embodiment of the present disclosure is directed to a computer-implemented method for use with an electronic design. The method may include receiving, at a graphical user interface, an indication of a desired wire creation associated with an electronic design and determining a plurality of routing solutions, based upon, at least in part, the desired wire creation. The method may further include simultaneously displaying the plurality of routing solutions at the graphical user interface, wherein a predicted preferred routing solution is graphically emphasized. The method may also include receiving a selection from a user, at the graphical user interface, of one of the plurality of routing solutions and storing the selection for subsequent use.

One or more of the following features may be included. In some embodiments, the method may include determining a second plurality of routing solutions based upon, at least in part, the selection. In some embodiments, receiving the indication may include a creation of a wire from a pin or a selection of a starting point and an ending point for a wire. The plurality of routing solutions may include three routing solutions. In some embodiments, simultaneously displaying may include displaying the plurality of routing solutions in different levels of transparency. In some embodiments, simultaneously displaying may include displaying the plurality of routing solutions in different colors. The method may further include displaying a new parameter update based upon, at least in part, the selection. The parameter update may include at least one of wire length and wire resistance. In some embodiments, determining a plurality of routing solutions may be based upon, at least in part, one or more analyzed user habits, one or more hard coded parameters or one or more user settings.

In another embodiment of the present disclosure a computer-readable storage medium having stored thereon instructions, which when executed by a processor result in a number of operations is provided. Operations may include receiving, at a graphical user interface, an indication of a desired wire creation associated with an electronic design and determining a plurality of routing solutions, based upon, at least in part, the desired wire creation. Operations may further include simultaneously displaying the plurality of routing solutions at the graphical user interface, wherein a predicted preferred routing solution is graphically emphasized. Operations may also include receiving a selection from a user, at the graphical user interface, of one of the plurality of routing solutions and storing the selection for subsequent use.

One or more of the following features may be included. In some embodiments, the method may include determining a second plurality of routing solutions based upon, at least in part, the selection. In some embodiments, receiving the indication may include a creation of a wire from a pin or a selection of a starting point and an ending point for a wire. The plurality of routing solutions may include three routing solutions. In some embodiments, simultaneously displaying may include displaying the plurality of routing solutions in different levels of transparency. In some embodiments, simultaneously displaying may include displaying the plurality of routing solutions in different colors. Operations may further include displaying a new parameter update based upon, at least in part, the selection. The parameter update may include at least one of wire length and wire resistance. In some embodiments, determining a plurality of routing solutions may be based upon, at least in part, one or more analyzed user habits, one or more hard coded parameters or one or more user settings.

In yet another embodiment of the present disclosure a computing system for use in an electronic circuit design is provided. The system may include at least one processor configured to receive, at a graphical user interface, an indication of a desired wire creation associated with an electronic design. The at least one processor may be further configured to determine a plurality of routing solutions, based upon, at least in part, the desired wire creation. The at least one processor may be further configured to simultaneously display the plurality of routing solutions at the graphical user interface, wherein a predicted preferred routing solution is graphically emphasized. The at least one processor may be further configured to receive a selection from a user, at the graphical user interface, of one of the plurality of routing solutions. The at least one processor may be further configured to store the selection for subsequent use.

One or more of the following features may be included. In some embodiments, the at least one processor may be further configured to determine a second plurality of routing solutions based upon, at least in part, the selection.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity Like reference numerals in the drawings denote like elements.

Figure 1:
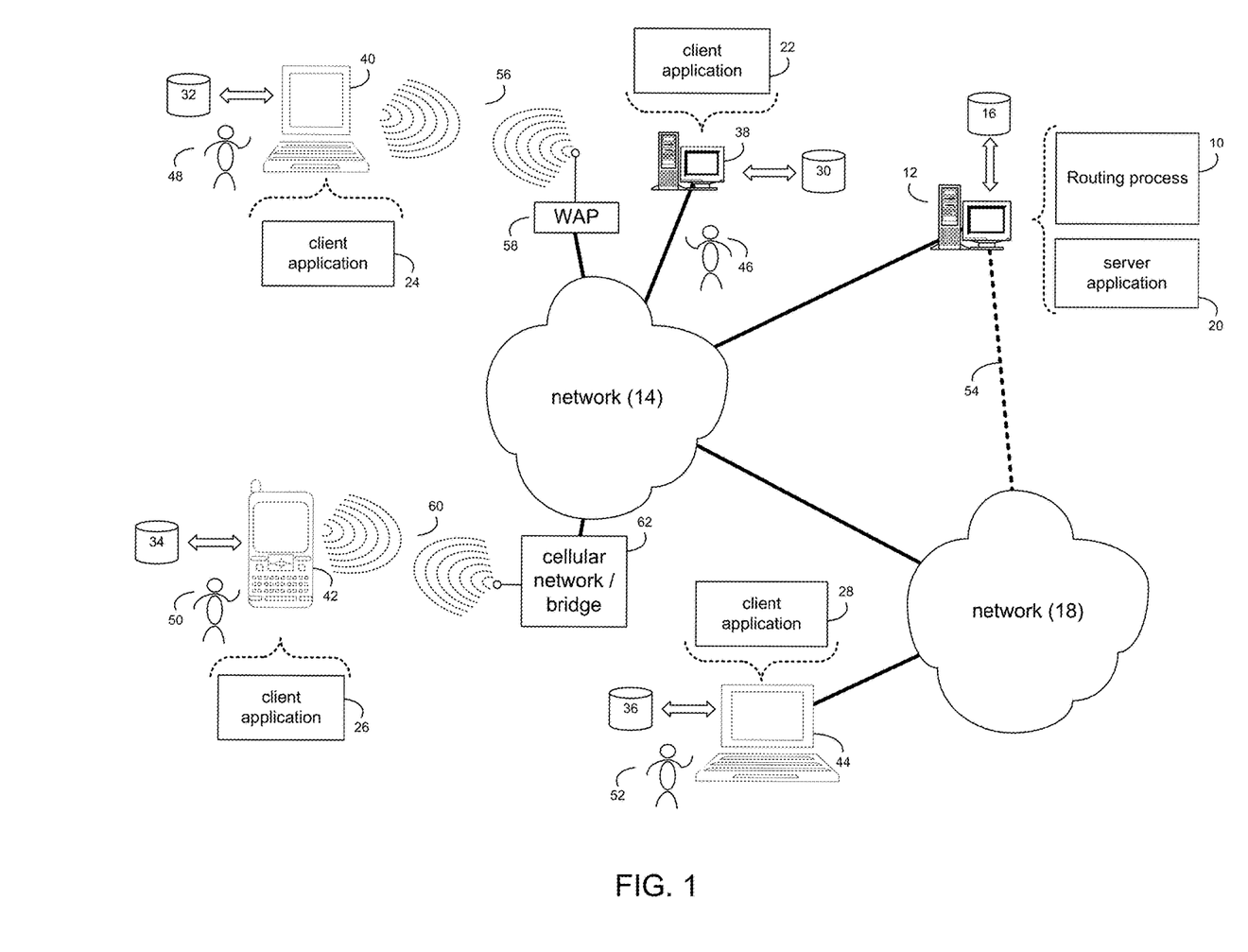
FIG. 1 diagrammatically depicts a routing process coupled to a distributed computing network.

Referring to FIG. 1, there is shown routing process 10 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™; or Redhat Linux™, for example. Additionally and/or alternatively, the routing process may reside on a client electronic device, such as a personal computer, notebook computer, personal digital assistant, or the like.

As will be discussed below in greater detail, routing process 10 may be used to estimate the current in a wire that is being created manually by creating a virtual terminal. The current of this virtual terminal may correspond to the missing current in the partial routed net graph as such the sum of the terminal's current on the partial net graph is now equal to 0. The virtual terminal may be inserted either at the beginning or the end of the wire which current must be estimated. The location of this virtual terminal is critical to get the best current estimation. Accordingly, embodiments of routing process 10 may allow for estimation of the current of a wire during its manual edition, before the net is fully routed.

The instruction sets and subroutines of routing process 10, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS Novell Webserver or Apache Webserver that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute routing process 10. Examples of client applications 22, 24, 26, 28 may include, but are not limited to, design verification tools such as those available from the assignee of the present disclosure. These applications may also be executed by server computer 12. In some embodiments, routing process 10 may be a stand-alone application that interfaces with server application 20 or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the routing process may be a client-side application (not shown) residing on one or more client electronic devices 38, 40, 42, 44 (e.g., stored on storage devices 30, 32, 34, 36, respectively). As such, the routing process may be a stand-alone application that interfaces with a client application (e.g., client applications 22, 24, 26, 28), or may be an applet/application that is executed within a client application. As such, the routing process may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features verify a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, routing process 10 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows™, Microsoft Windows CE™, Redhat Linux™, Apple iOS, ANDROID, or a custom operating system.

Figure 2:
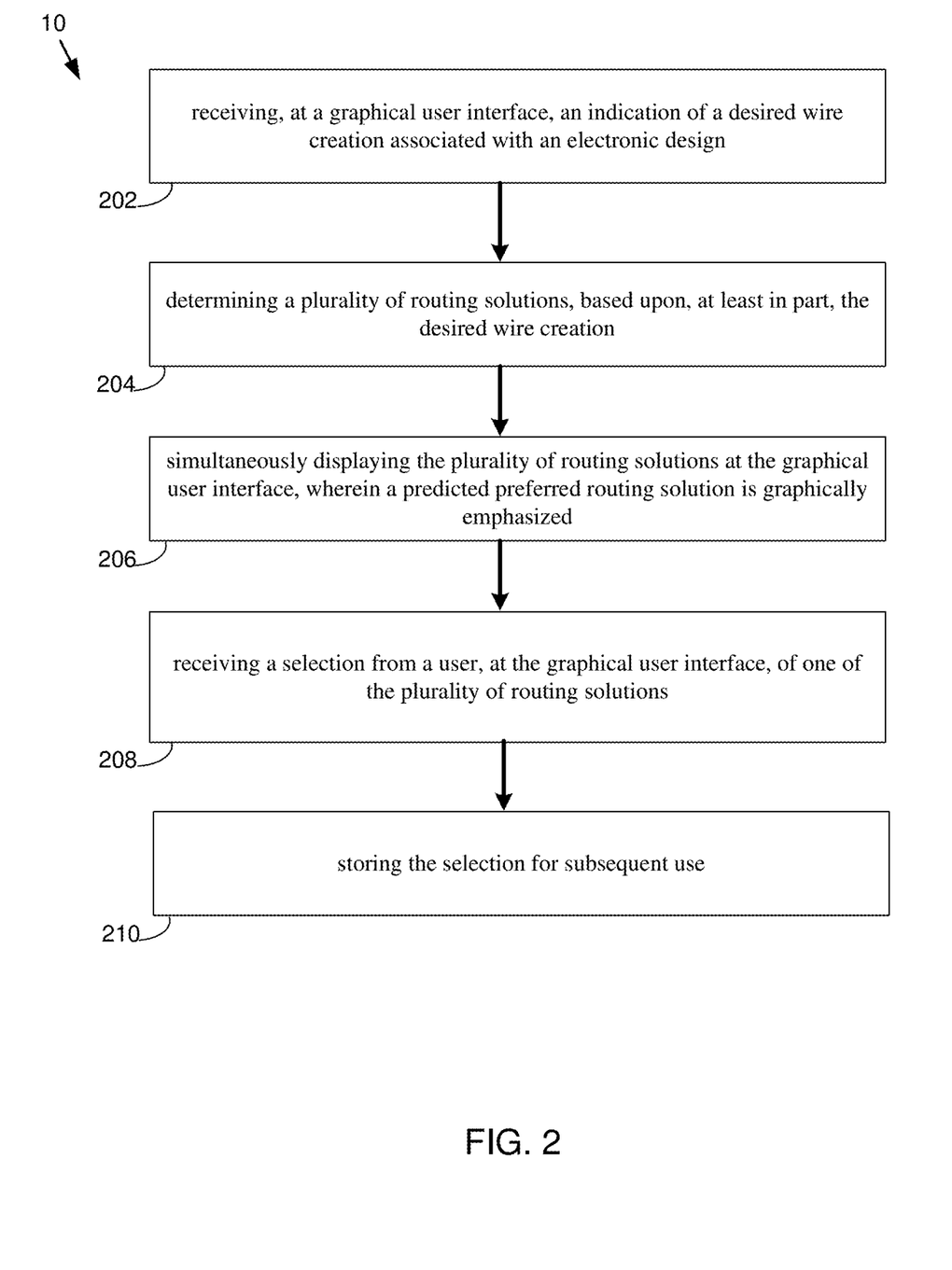
FIG. 2 is an exemplary flowchart of a routing process according to an embodiment of the present disclosure.

Referring now to FIG. 2, a flowchart depicting an embodiment consistent with routing process 10 is provided. The method may include receiving 202, at a graphical user interface, an indication of a desired wire creation associated with an electronic design and determining 204 a plurality of routing solutions, based upon, at least in part, the desired wire creation. The method may further include simultaneously displaying 206 the plurality of routing solutions at the graphical user interface, wherein a predicted preferred routing solution is graphically emphasized. The method may also include receiving 208 a selection from a user, at the graphical user interface, of one of the plurality of routing solutions and storing the selection for subsequent use. Numerous other operations are also within the scope of the present disclosure as provided in further detail hereinbelow.

As discussed above, packaging and analog IC layout designers are really concerned by the routing style of their design and this style depends on each designer. Embodiments of routing process 10 may allow the designer to quickly route a design as he/she expects. As discussed in further detail below, embodiments of routing process 10 may display multiple routing solutions at the same time while the user is editing their wires and allows the user to decide in a single selection (e.g., mouse click, etc.) what is the best solution according to its own criteria. The user neither needs to change the settings nor redo the routing to obtain the results they expects on the first shot. In this way, using routing process 10 the user may immediately visualize the expected routing without having to randomly change the command settings and try to route its wires again and again.

Referring now to FIGS. 3-9, embodiments of routing process 10 may be configured to generate multiple routing strategies using different settings frequently modified by the user. This differs from prior solutions that would display only one routing solution on the screen.

Figure 3:
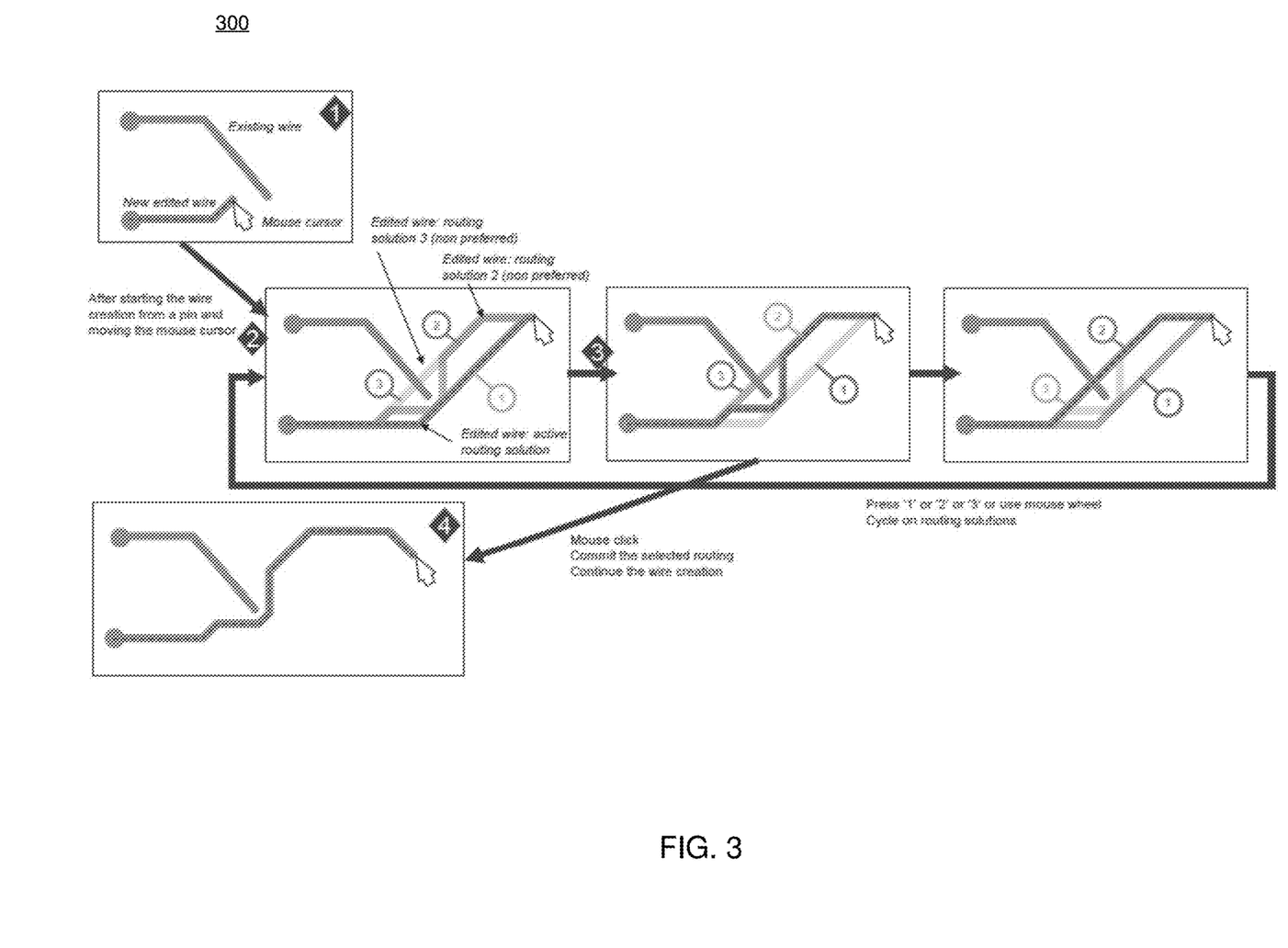
FIG. 3 is an illustration of a schematic of a routing process according to an embodiment of the present disclosure.

As shown in FIG. 3, a schematic 300 of routing process 10 showing an example of packaging routing and interactive wire editing is provided. This example shows an interactive routing example using a manual wire creation command in an EDA application 20 such as a package routing tool. As shown below, routing process 10 may propose multiple routing solutions (e.g., three) to avoid creating a short between two wires.

In operation, routing process 10 may begin with the creation of a wire from a pin in a first operation ("1"). In this example an existing wire is shown and a new edited wire is created by the user. Upon moving the mouse cursor, routing process 10 may automatically compute and display a plurality of routing solutions to avoid obstructions/smooth the wire ("2"). Routing process 10 may simultaneously display a plurality of routing solutions at a graphical user interface. This may be achieved using different levels of transparency on each routing solution, displaying the plurality of routing solutions in different colors or using any suitable approach.

In some embodiments, a predicted preferred routing solution option may be displayed in a particular color, highlighted, or otherwise emphasized (e.g., the dotted line shown in the middle of each line, etc.). In contrast, the non-preferred routing solutions may be displayed using transparent colors. The user may cycle between the solutions (shown in operation "3") or directly choose his preferred solution. This may be achieved using any suitable approach, including but not limited, to keyboard selection, mouse selection via clickwheel, etc. In just a selection (e.g., mouse click, etc.) the user may commit the results to the database. Accordingly, the user may be able to visualize all of the routing solutions in one shot without requiring the user to review the setting forms to select another routing style.

Figure 4:
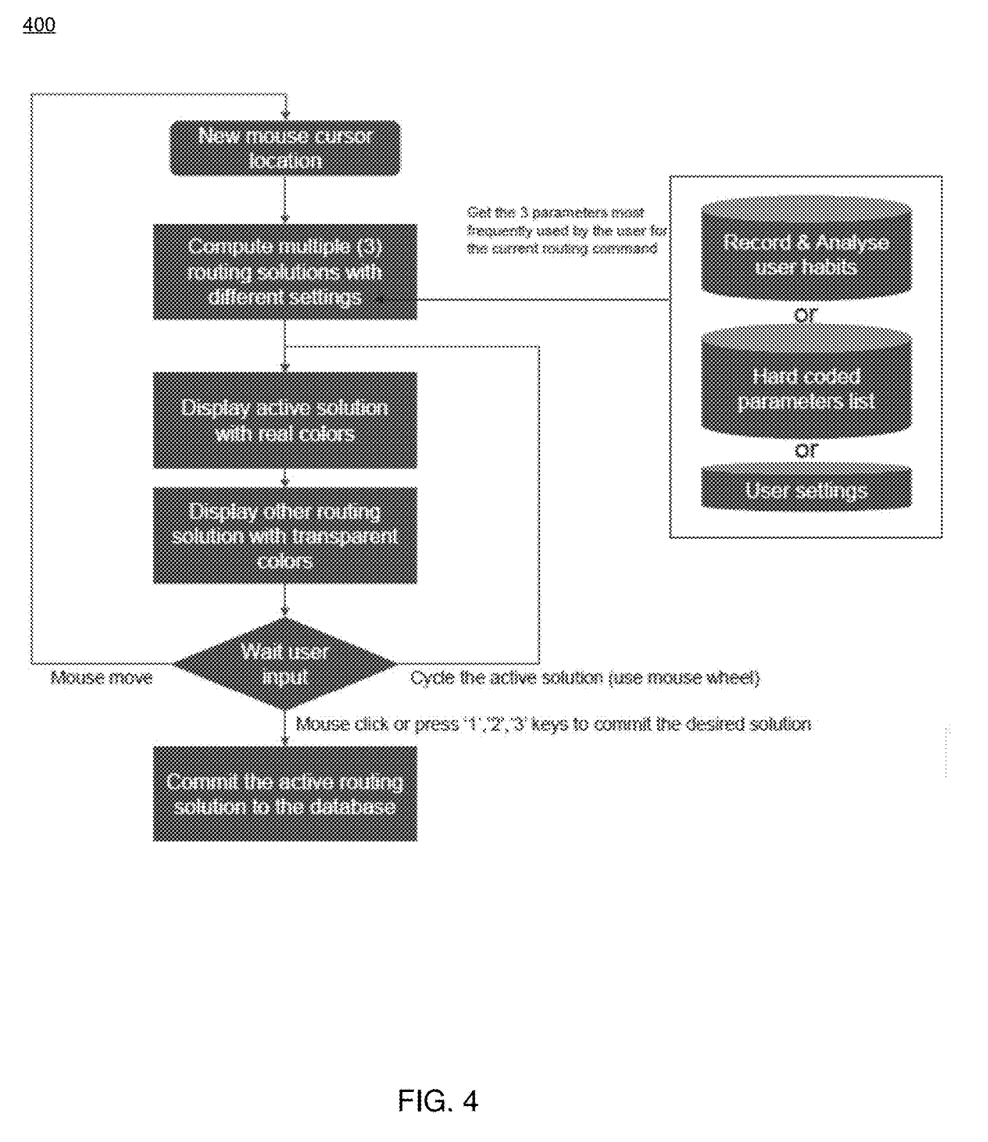
FIG. 4 is an exemplary flowchart of a routing process according to an embodiment of the present disclosure.

Referring now to FIG. 4, a flowchart 400 depicting operations consistent with embodiments of routing process 10 is provided. Routing process 10 may determine a new mouse location at a graphical user interface and compute multiple routing solutions with different settings. In one particular embodiments three routing solutions may be displayed but this is merely provided by way of example as any suitable number may be employed. Routing process 10 may be configured to determine a plurality of routing solutions based upon, one or more analyzed user habits, one or more hard coded parameters, one or more user settings, etc. Any or all of these may be stored in a database (e.g., storage device 16) accessible by routing process 10. Routing process may be configured to display the preferred and non-preferred routing solutions at the graphical user interface (e.g. using real and/or transparent colors). Routing process 10 may wait for user input, which may then provide usable feedback to routing process 10, which may learn from the user's individual selection. The user's active selection may be committed to one or more databases. Accordingly, routing process 10 may determine a second plurality of routing solutions based upon the user's selection, which allows the process to learn from each individual user's selections and improve upon the suggestions over time.

Figure 5:
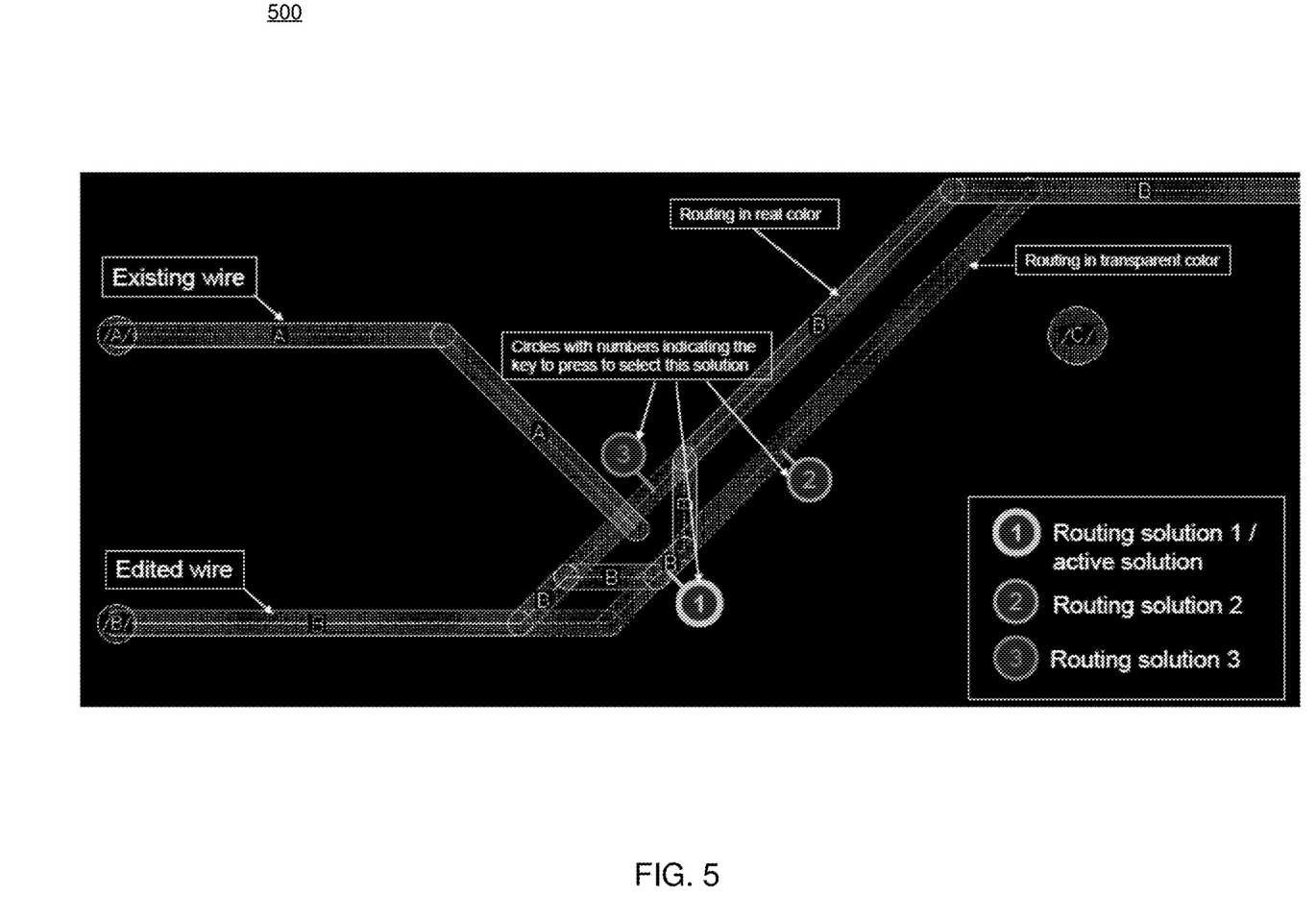
FIG. 5 is an illustration of a schematic of a routing process according to an embodiment of the present disclosure.
Figure 6:
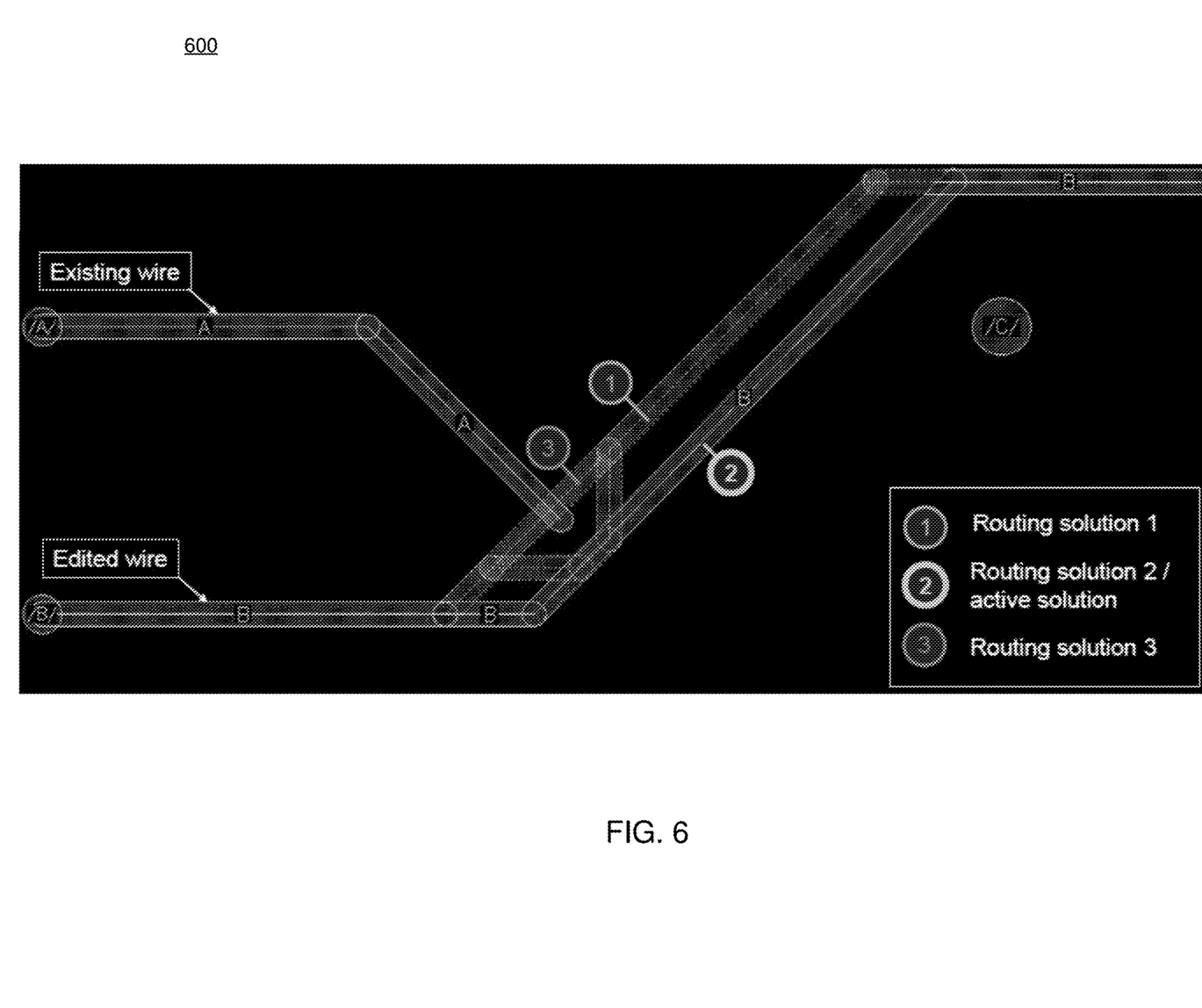
FIG. 6 is an illustration of a schematic of a routing process according to an embodiment of the present disclosure.
Figure 7:
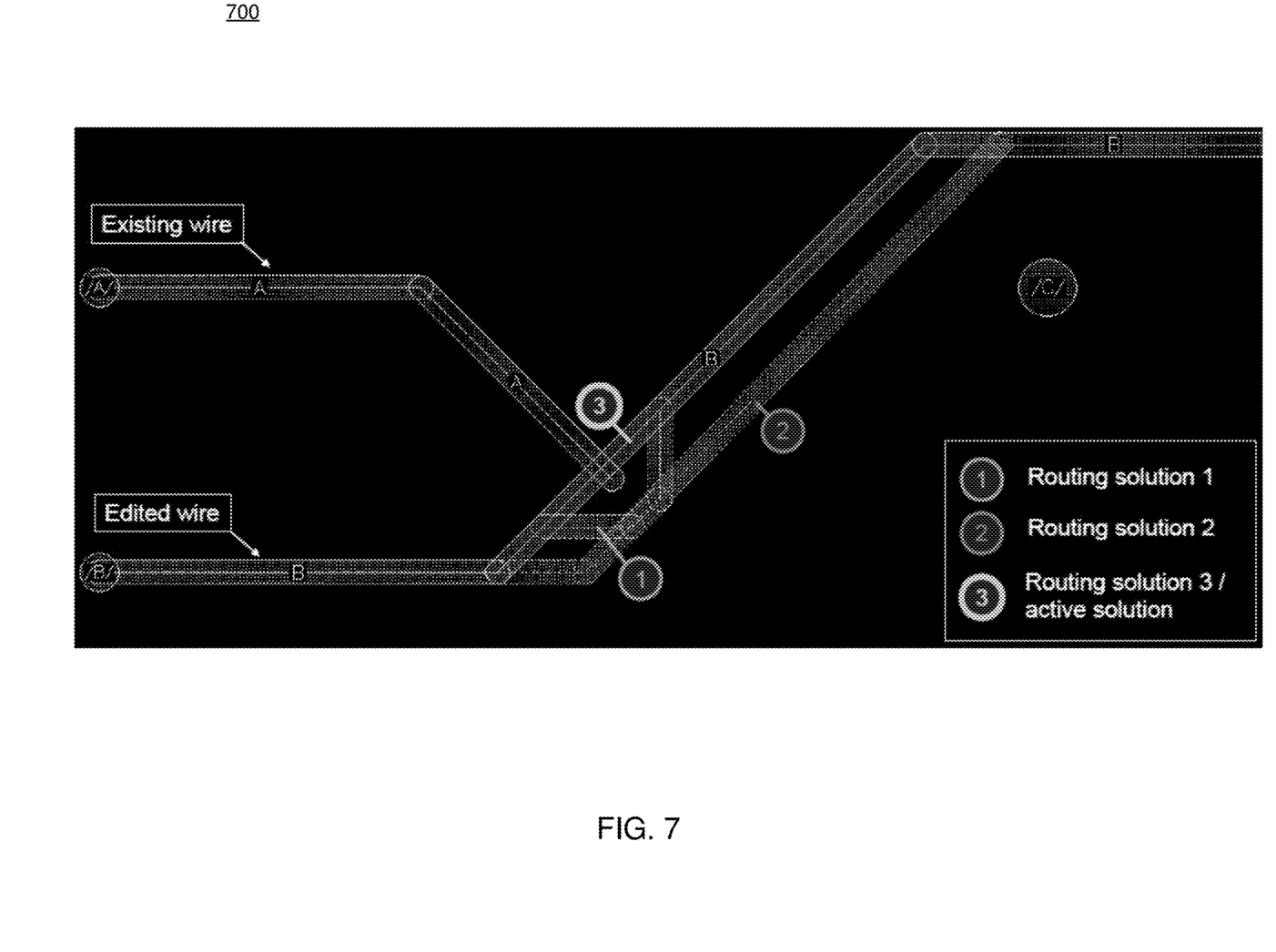
FIG. 7 is an illustration of a schematic of a routing process according to an embodiment of the present disclosure.

Referring now to FIGS. 5-7, graphical user interfaces 500, 600, and 700 consistent with embodiments of routing process 10 are provided. More particularly, FIGS. 5-7 show examples of screenshots of routing in a layout EDA application 20 using routing process 10 in the context of the example of FIG. 3. GUI 500 shows an existing wire "A" and a currently edited wire "B" being drawn by a user. As shown in the figure, each possible routing solution may be annotated using any suitable approach (e.g., with a number in a circle as shown in FIGS. 5-7) in order to be identified. The active solution that may be committed to the database by default may be shown in a regular color whereas additional solutions may be displayed in light transparent colors. The user may then be able to select the routing strategy that best matches their needs. The user may just press the key number corresponding to their preferred solution, use the mouse wheel to cycle on the solutions (e.g., FIG. 5-option "1", FIG. 6-option "2", and FIG. 7-option "3"), use a mouse click to validate their choice or any suitable technique. Routing process 10 may then save the routing solution in the database, which allows routing process 10 to learn and improve upon its suggestions.

Figure 8:
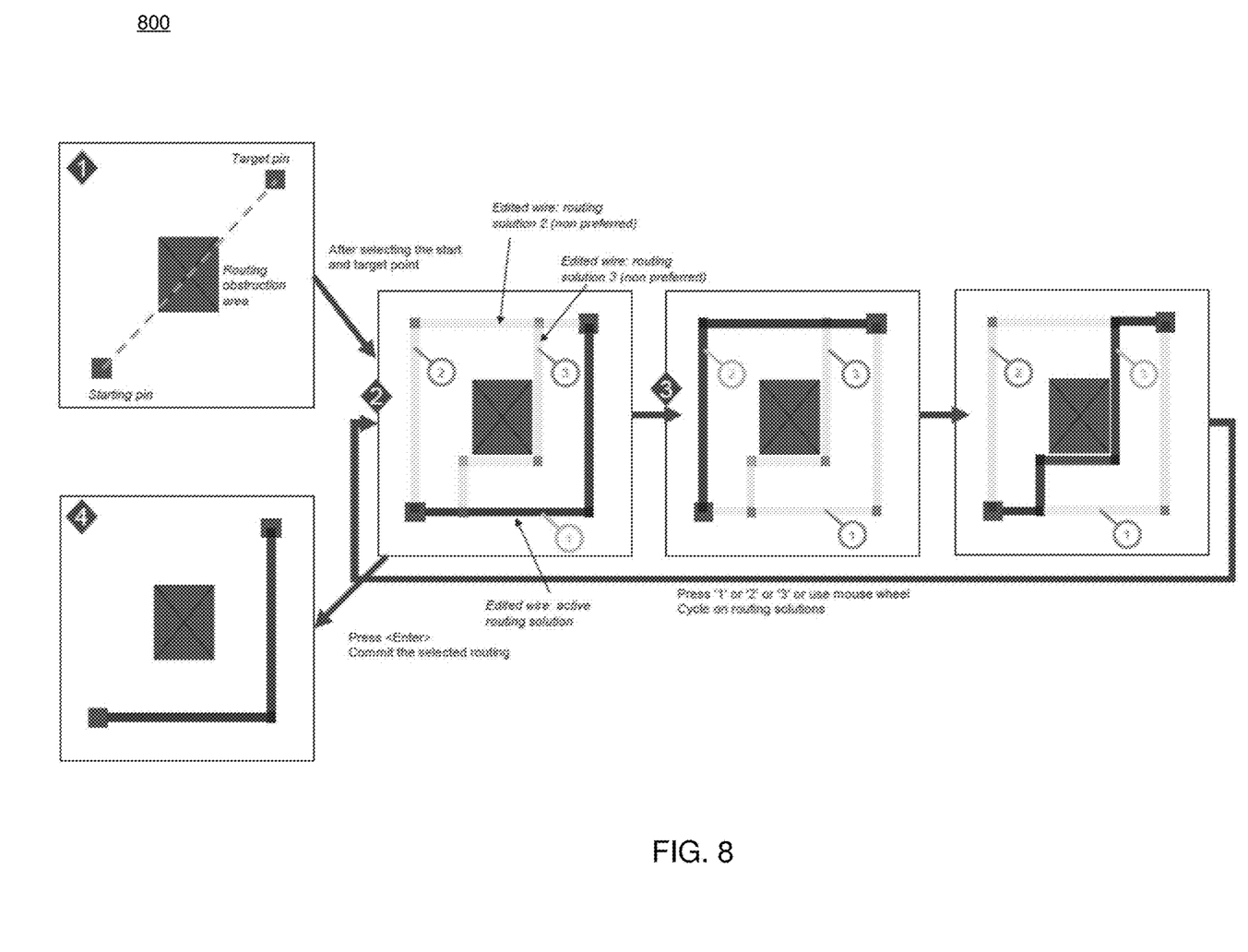
FIG. 8 is an illustration of a schematic of a routing process according to an embodiment of the present disclosure.

As shown in FIG. 8, a schematic 800 of routing process 10 showing an example of packaging routing and interactive wire editing is provided. This example shows an example of a point to point routing command in an IC design having a routing obstruction area located between the starting and target pin. In this example, routing process 10 may propose three solutions to route between two pins and avoid routing obstructions.

In operation, point to point routing may include selecting the starting and ending point for the user's desired routing (see, e.g., operation "1"). Routing process 10 may automatically compute and display multiple routing solutions that may avoid the routing obstruction area. The non-preferred routing options may be displayed using transparent colors or any de-emphasized approach. The user may then cycle between the solutions or directly choose his/her preferred solution. Using just one selection (e.g., mouse click, etc.) the user may commit the results to the database. In this way, routing process 10 allows the user to proceed without restarting the command from the beginning to change the settings to get another routing solution.

Figure 9:
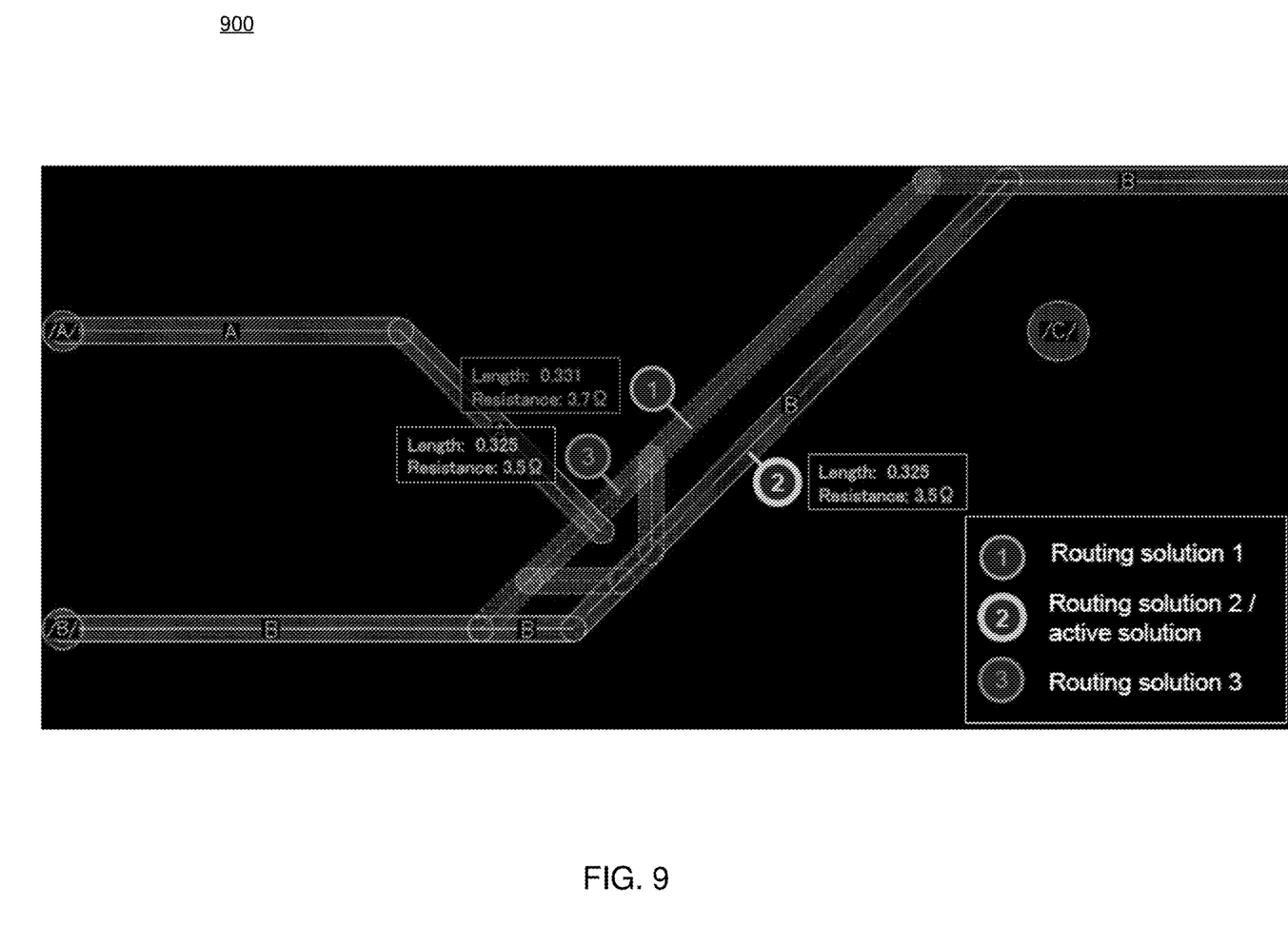
FIG. 9 is an illustration of a schematic of a routing process according to an embodiment of the present disclosure.

Referring now to FIG. 9, a graphical user interface 900 showing the real-time display of a new parameter update based upon the user selection. Some parameters may include, but are not limited to, wire length, wire resistance or any other suitable information. In this particular example, routing solution "1" yields a wire length of 0.331 and a resistance of 3.7Ω, routing solution "2" yields a wire length of 0.325 and a resistance of 3.5Ω, and routing solution "3" yields a wire length of 0.325 and a resistance of 3.5Ω.

Embodiments of routing process 10 may be applied to many types of commands in integrated circuit, packaging and printed circuit board applications. Routing process 10 may simultaneously display multiple solutions that would be provided by an interactive or automatic routing engine using different settings. Embodiments of routing process 10 may allow the user to select the solution that best meets his/her needs without having to manually change any setting. This saves an enormous amount of time for the user and makes provides a more intuitive approach as the user does not need to learn the effects of each settings on the command.

It will be apparent to those skilled in the art that various modifications and variations can be made in the current estimation scheme and debugging process of embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A computer-implemented method for use with an electronic design comprising:
   receiving, at a graphical user interface, an indication of a desired wire creation associated with an electronic design, wherein receiving the indication includes a selection of a starting point and an ending point for a wire;
   determining a plurality of routing solutions, based upon, at least in part, the desired wire creation;
   simultaneously displaying the plurality of routing solutions at the graphical user interface, wherein a predicted preferred routing solution is graphically emphasized;
   receiving a selection from a user, at the graphical user interface, of one of the plurality of routing solutions; and
   storing the selection for subsequent use.

2. The computer-implemented method of claim 1, further comprising:
   determining a second plurality of routing solutions based upon, at least in part, the selection.

3. The computer-implemented method of claim 1, wherein the plurality of routing solutions includes three routing solutions.

4. The computer-implemented method of claim 1, wherein simultaneously displaying includes displaying the plurality of routing solutions in different levels of transparency.

5. The computer-implemented method of claim 1, wherein simultaneously displaying includes displaying the plurality of routing solutions in different colors.

6. The computer-implemented method of claim 1, further comprising:
   displaying a new parameter update based upon, at least in part, the selection.

7. The computer-implemented method of claim 6, wherein the parameter update includes wire length and wire resistance.

8. The computer-implemented method of claim 1, wherein determining a plurality of routing solutions is based upon, at least in part, one or more analyzed user habits or one or more user settings.

9. A non-transitory computer-readable storage medium having stored thereon instructions, which when executed by a processor result in the following operations:
   receiving, at a graphical user interface, an indication of a desired wire creation associated with an electronic design, wherein receiving the indication includes a selection of a starting point and an ending point for a wire;
   determining a plurality of routing solutions, based upon, at least in part, the desired wire creation;
   simultaneously displaying the plurality of routing solutions at the graphical user interface, wherein a predicted preferred routing solution is graphically emphasized;
   receiving a selection from a user, at the graphical user interface, of one of the plurality of routing solutions; and
   storing the selection for subsequent use.

10. The computer-readable storage medium of claim 9, wherein operations further comprise:
    determining a second plurality of routing solutions based upon, at least in part, the selection.

11. The computer-readable storage medium of claim 9, wherein operations further comprise, wherein the plurality of routing solutions includes three routing solutions.

12. The computer-readable storage medium of claim 9, wherein operations further comprise, wherein simultaneously displaying includes displaying the plurality of routing solutions in different levels of transparency.

13. The computer-readable storage medium of claim 9, wherein operations further comprise, wherein simultaneously displaying includes displaying the plurality of routing solutions in different colors.

14. The computer-readable storage medium of claim 9, wherein operations further comprising:
 displaying a new parameter update based upon, at least in part, the selection.

15. The computer-readable storage medium of claim 14, wherein operations further comprise, wherein the parameter update includes wire length and wire resistance.

16. The computer-readable storage medium of claim 9, wherein operations further comprise, wherein determining a plurality of routing solutions is based upon, at least in part, one or more analyzed user habits or one or more user settings.

17. A computing system for use in an electronic circuit design comprising:
 at least one processor configured to receive, at a graphical user interface, an indication of a desired wire creation associated with an electronic design, wherein receiving the indication includes a selection of a starting point and an ending point for a wire, the at least one processor further configured to determine a plurality of routing solutions, based upon, at least in part, the desired wire creation, the at least one processor further configured to simultaneously display the plurality of routing solutions at the graphical user interface, wherein a predicted preferred routing solution is graphically emphasized, the at least one processor further configured to receive a selection from a user, at the graphical user interface, of one of the plurality of routing solutions, the at least one processor further configured to store the selection for subsequent use.

18. The system of claim 17, wherein the at least one processor is further configured to determine a second plurality of routing solutions based upon, at least in part, the selection.

* * * * *